(12) United States Patent
Fujita (10) Patent No.: US 9,657,997 B2
(45) Date of Patent: May 23, 2017

(54) COOLING DEVICE WITH COOLING PASSAGE FOR LIQUID REFRIGERANT AND JUXTAPOSED FIN ASSEMBLY

(75) Inventor: Satoru Fujita, Utsunomiya (JP)

(73) Assignee: HONDA MOTOR CO., LTD., Tokyo (JP)

( * ) Notice: Subject to any disclaimer, the term of this patent is extended or adjusted under 35 U.S.C. 154(b) by 570 days.

(21) Appl. No.: 13/879,977

(22) PCT Filed: Oct. 12, 2011

(86) PCT No.: PCT/JP2011/073390
§ 371 (c)(1),
(2), (4) Date: Apr. 17, 2013

(87) PCT Pub. No.: WO2012/056880
PCT Pub. Date: May 3, 2012

(65) Prior Publication Data
US 2013/0206371 A1  Aug. 15, 2013

(30) Foreign Application Priority Data

Oct. 27, 2010  (JP) .................................. 2010-240225

(51) Int. Cl.
*F28F 7/00* (2006.01)
*F28D 15/00* (2006.01)
(Continued)

(52) U.S. Cl.
CPC .............. *F28D 15/00* (2013.01); *F28F 3/048* (2013.01); *F28F 3/12* (2013.01); *H01L 23/473* (2013.01);
(Continued)

(58) Field of Classification Search
CPC .............. H01L 23/473; H05K 7/20254; H05K 7/20927; H05K 7/20; H05K 7/20436; F28D 15/00; F28F 3/048; F28F 3/12
See application file for complete search history.

(56) References Cited

U.S. PATENT DOCUMENTS 6,992,382 B2 *  1/2006  Chrysler ............... H01L 23/473
                                                              257/706
8,120,914 B2 *  2/2012  Kajiura ........................ 361/699
(Continued)

FOREIGN PATENT DOCUMENTS

JP    2007-207917 A    8/2007
JP    2009-212136 A    9/2009

*Primary Examiner* — Len Tran
*Assistant Examiner* — Gordon Jones
(74) *Attorney, Agent, or Firm* — Westerman, Hattori, Daniels & Adrian, LLP (57) ABSTRACT

A cooling device includes a mounting surface, a cooling fin on a rear surface side of the mounting surface, and a cooling passage for cooling the cooling fin with a liquid refrigerant. The refrigerant flows from a flow inlet to the cooling passage and discharges from a discharge outlet. The cooling passage comprises a first surface provided with the cooling fin, a second surface opposing the first surface, and a wall portion between the first surface and the second surface, and is longer than a channel connecting the flow inlet and the discharge outlet. The wall portion has a first wall portion extending from the second surface to the first surface, and a second wall portion extending in parallel with the first wall portion from the first surface to a height exceeding a top portion of the first wall.

8 Claims, 7 Drawing Sheets

(51) Int. Cl.
    *H01L 23/473*    (2006.01)
    *H05K 7/20*    (2006.01)
    *F28F 3/04*    (2006.01)
    *F28F 3/12*    (2006.01)
    *H01L 23/367*    (2006.01)

(52) U.S. Cl.
    CPC ...... *H05K 7/20436* (2013.01); *H01L 23/3672* (2013.01); *H01L 2924/0002* (2013.01)

(56) References Cited

U.S. PATENT DOCUMENTS

| | | | |
|---|---|---|---|
| 8,331,092 B2* | 12/2012 | Kawaura | H01L 23/473 165/80.2 |
| 8,339,785 B2* | 12/2012 | Chang | H05K 7/20927 165/80.4 |
| 2004/0003916 A1* | 1/2004 | Nash et al. | 165/153 |
| 2005/0103472 A1* | 5/2005 | Lofland | F28F 3/12 165/80.4 |
| 2009/0114373 A1* | 5/2009 | Sawaguchi et al. | 165/104.19 |
| 2010/0238629 A1 | 9/2010 | Shiba | |

\* cited by examiner

FIG. 7 PRIOR ART

COOLING DEVICE WITH COOLING PASSAGE FOR LIQUID REFRIGERANT AND JUXTAPOSED FIN ASSEMBLY

CROSS-REFERENCED TO RELATED APPLICATIONS

This application is a National Stage entry of International Application PCT/JP2011/073390 filed Oct. 12, 2011, which claims priority to Japanese Application No. 2010-240225, filed Oct. 27, 2010, the disclosure of these prior applications are hereby incorporated in their entirety by reference.

TECHNICAL FIELD

The present invention relates to a cooling structure for cooling a target object with a liquid refrigerant.

BACKGROUND ART

Electric devices such as inverters (power converters) for use on electric automobiles, fuel cell automobiles, etc., for example, are made up of various electric components (active components and passive components) such as switching elements, reactors, capacitors, etc. Since such electric components generate a considerable amount of heat when energized, the components need to be cooled sufficiently.

Japanese Laid-Open Patent Publication No. 2007-207917 (hereinafter referred to as "JP2007-207917A") discloses a structure for cooling an inverter with a liquid refrigerant that flows through a cooling passage having cooling fins, the inverter being disposed on an upper surface of the cooling passage.

SUMMARY OF INVENTION

Certain types of cooling passages have a structure that extends in a straight direction from an inlet port to an outlet port for a liquid refrigerant, whereas other types of cooling passages have a meandering or bent structure depending on the layout and number of parts of an electric device that serves as the target object to be cooled. Cooling passages having such a meandering or bent structure provide a roundabout channel between the inlet port and the outlet port. More specifically, according to a structure in which a case, including a wall that is higher than the cooling fins, is covered with a cap to define a cooling passage, thereby providing a roundabout channel (see, for example, JP2007-207917A), a liquid refrigerant, which is introduced from an inlet port, flows directly from a gap between the top surface of the wall and the inner surface of the cap into the cooling passage near an outlet port. In this case, a potential exists for the cooling passage not to be supplied with a sufficient amount of liquid refrigerant.

Figure 7:
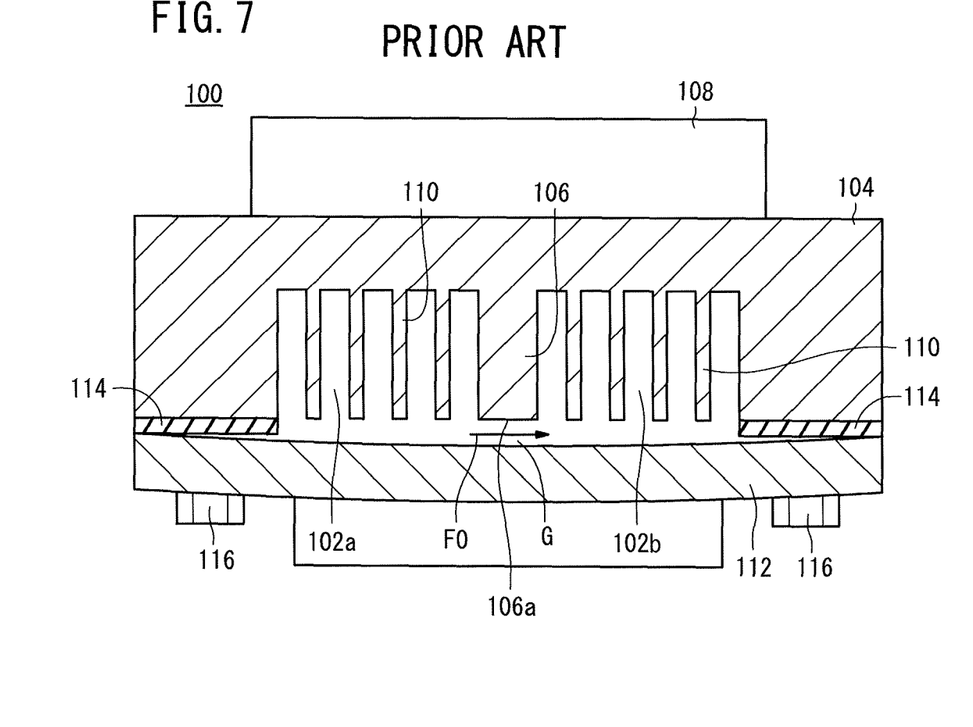
FIG. 7 is a cross-sectional view of a cooling device including a roundabout channel defined by a wall disposed in a cooling passage.

FIG. 7 of the accompanying drawings shows, by way of example, a cooling device 100 with a roundabout channel defined by a wall disposed in a cooling passage. The cooling device 100 shown in FIG. 7 includes an outward passageway 102a through which a liquid refrigerant flows immediately after the liquid refrigerant has been introduced from an inlet port, and a homeward passageway 102b through which the liquid refrigerant flows after the liquid refrigerant has returned from a non-illustrated turnaround section. The passageways 102a, 102b are mutually separated and lie parallel to each other, one on each side of a wall 106 disposed in a casing 104. The passageways 102a, 102b house cooling fins 110 therein for cooling an electric component 108 that is placed on the casing 104. The cooling fins 110 extend along directions in which the liquid refrigerant flows, i.e., in directions perpendicular to the sheet of FIG. 7. The wall 106 includes a top surface 106a, which is held in contact with an inner surface of a casing cap 112 mounted on the casing 104, thereby separating the passageways 102a, 102b from each other. Sealing members 114 are provided, which form a seal between the casing 104 and the casing cap 112. The casing 104 and the casing cap 112 are fastened to each other by bolts 116.

With the cooling device 100 constructed in the foregoing manner, if due to poor assembling and machining accuracy, the liquid refrigerant leaks from a gap G that is created between the top surface 106a of the wall 106 and the inner surface of the casing cap 112, then as indicated by the arrow F0 in FIG. 7, the liquid refrigerant flows directly from the passageway 102a that leads from the inlet port into the passageway 102b that leads to the outlet port. Therefore, the liquid refrigerant does not flow through the passageways 102a, 102b sufficiently. In particular, when the casing cap 112 is bent under pressure from the liquid refrigerant, as shown in FIG. 7, the gap G widens and leakage of the refrigerant increases. As a result, the amount of liquid refrigerant that flows through the passageways 102a, 102b is further reduced, thus making it difficult for the cooling device 100 to cool the target object to be cooled sufficiently.

The present invention has been made in view of the aforementioned problems. An object of the present invention is to provide a cooling structure, which is capable of causing a liquid refrigerant to flow smoothly along a cooling passage, for thereby effectively cooling a target object.

The cooling structure according to the present invention has an installation surface for placement of a target object to be cooled, a cooling fin disposed on a reverse side of the installation surface, and a cooling passage for cooling the cooling fin with a liquid refrigerant that flows from an inlet port into the cooling passage and is discharged from an outlet port. The cooling passage has a first surface on which the cooling fin is disposed, a second surface confronting the first surface, and a wall assembly disposed between the first surface and the second surface, the cooling passage being constructed as a channel having a length that is longer than a straight line interconnecting the inlet port and the outlet port. The wall assembly has a first wall that extends from the second surface toward the first surface, and a second wall that extends in parallel with the first wall from the first surface to a height beyond a top of the first wall.

With the above arrangement, the wall assembly is disposed between the first surface, which has the cooling fins disposed thereon, and the second surface. The wall assembly has the first wall that extends from the second surface toward the first surface, and the second wall that extends in parallel with the first wall from the first surface to a height beyond a top of the first wall. Therefore, the wall assembly effectively prevents liquid refrigerant from flowing across and over the wall assembly by way of a short cut across a portion of the cooling passage from the inlet port to the outlet port as a result of a reduction in gap accuracy in the vicinity of the wall assembly, which may be caused due to poor assembling accuracy and machining accuracy of the cooling structure and the casing, or due to deformations caused by the pressure of the liquid refrigerant. Consequently, the liquid refrigerant flows smoothly through the cooling passage and cools the target object appropriately.

If the first wall and the second wall lie parallel to the cooling fin, then the first wall and the second wall impose an effectively higher flow resistance at the wall surfaces of the wall assembly. Thus, liquid refrigerant is prevented from flowing across and over the wall assembly more reliably.

The cooling structure may further include second cooling fins disposed on the second surface and positioned in the cooling passage in juxtaposed relation to the cooling fin, and a second installation surface disposed on a reverse side of the second surface for placement of a second target object to be cooled by the second cooling fins. The cooling structure, which is constructed in this manner, is capable of cooling different target objects more efficiently on upper and lower surfaces disposed on both sides of the cooling passage. The second cooling fins, which are disposed in confronting relation to the aforementioned cooling fins, are highly effective at preventing liquid refrigerant from flowing across and over the wall assembly.

The second wall may have a recess, and the first wall may be inserted in the recess. This arrangement provides a complex and elongate labyrinth structure in the wall assembly, thereby preventing the liquid refrigerant from flowing across and over the wall assembly more reliably.

The cooling passage may contain the liquid refrigerant therein, which flows in different directions respectively on one surface side and another surface side of the wall assembly.

The cooling passage may have a turnaround section on a way from the inlet port to the outlet port, and the wall assembly may comprise a dividing wall assembly that divides the cooling passage, which is folded back by the turnaround section, into an outward passageway and a homeward passageway. The cooling passage is thus divided into two passageways by a simple structure.

According to the present invention, the wall assembly is disposed between the second surface and the first surface having the cooling fins disposed thereon. The wall assembly further has the first wall, which extends from the second surface toward the first surface, and the second wall, which extends in parallel with the first wall from the first surface to a height beyond the top of the first wall. Therefore, the wall assembly is effective at preventing liquid refrigerant from flowing across and over the wall assembly, by way of a short cut across a portion of the cooling passage from the inlet port to the outlet port as a result of a reduction in gap accuracy in the vicinity of the wall assembly, which may be caused due to poor assembling accuracy and machining accuracy of the cooling structure and the casing, or due to deformations caused under the pressure of the liquid refrigerant. Consequently, the liquid refrigerant flows smoothly through the cooling passage and cools the target object appropriately.

DESCRIPTION OF EMBODIMENTS

Cooling structures according to preferred embodiments of the present invention will be described below with reference to the accompanying drawings.

Figure 1:
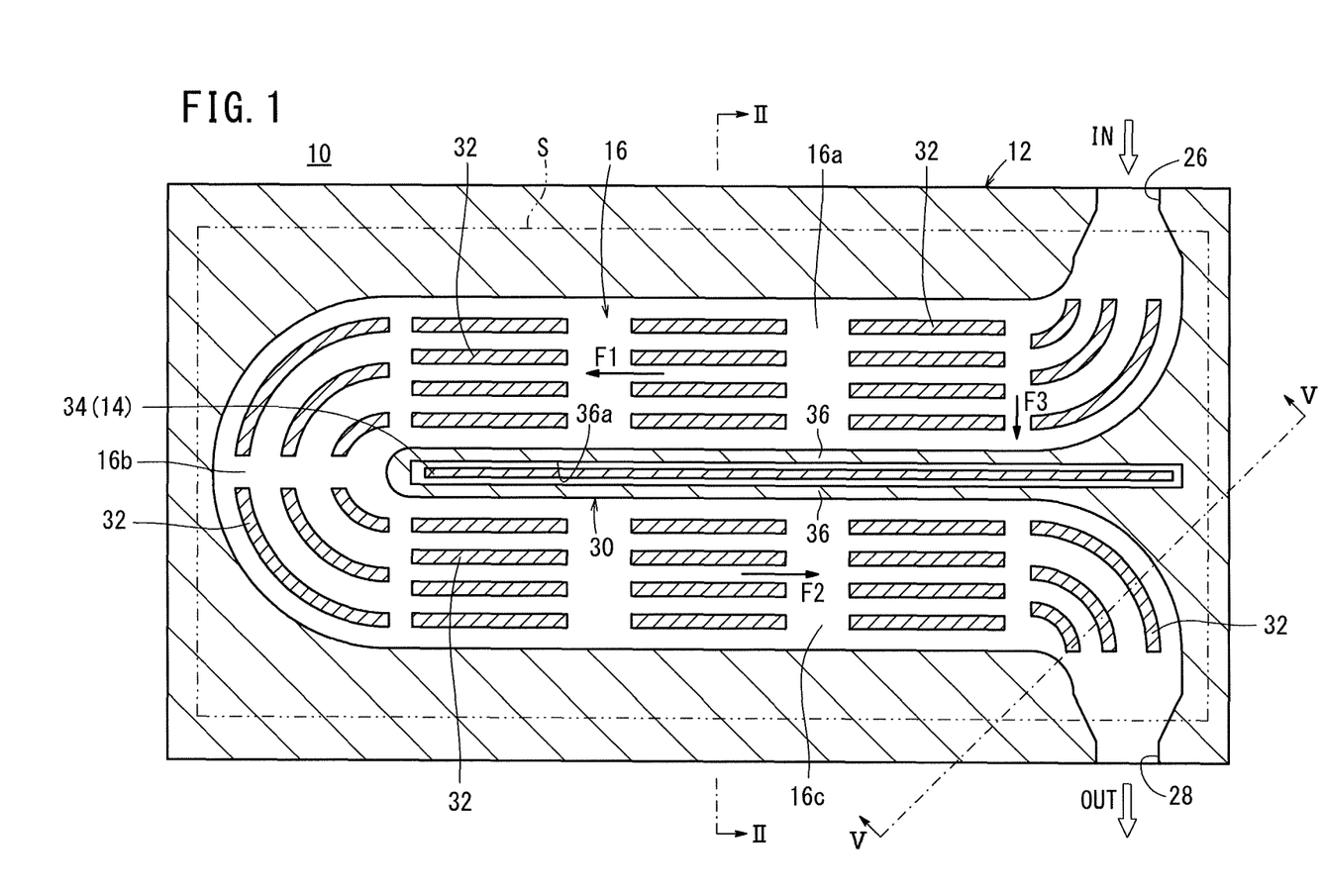
FIG. 1 is a sectional plan view of a cooling device, which serves as a cooling structure according to an embodiment of the present invention.
Figure 2A:
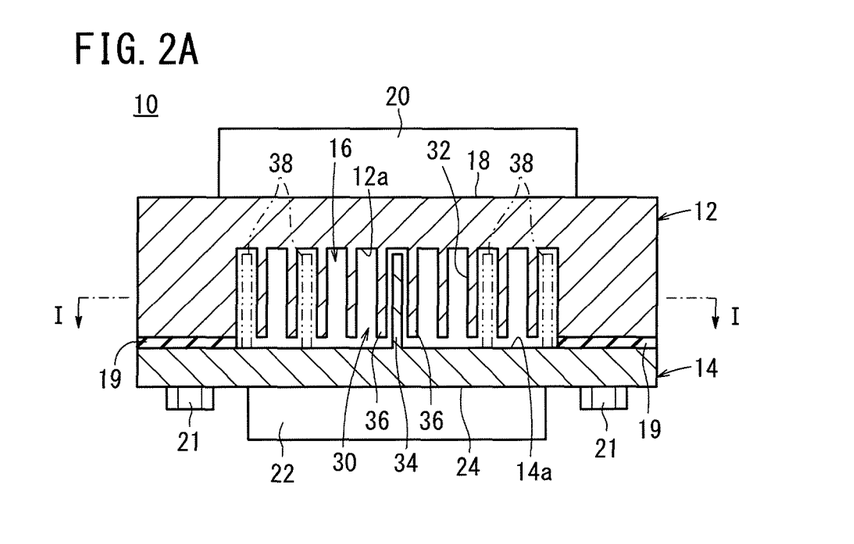
FIG. 2A is a cross-sectional view taken along line II-II of FIG. 1.

FIG. 1 shows in sectional plan view a cooling device 10, which serves as a cooling structure according to an embodiment of the present invention. FIG. 2A is a cross-sectional view taken along line II-II of FIG. 1, and FIG. 2B is an exploded cross-sectional view of the cooling device 10 shown in FIG. 2A, illustrating a heat sink body 12 and a heat sink cap 14 detached from the heat sink body 12.

Figure 2B:
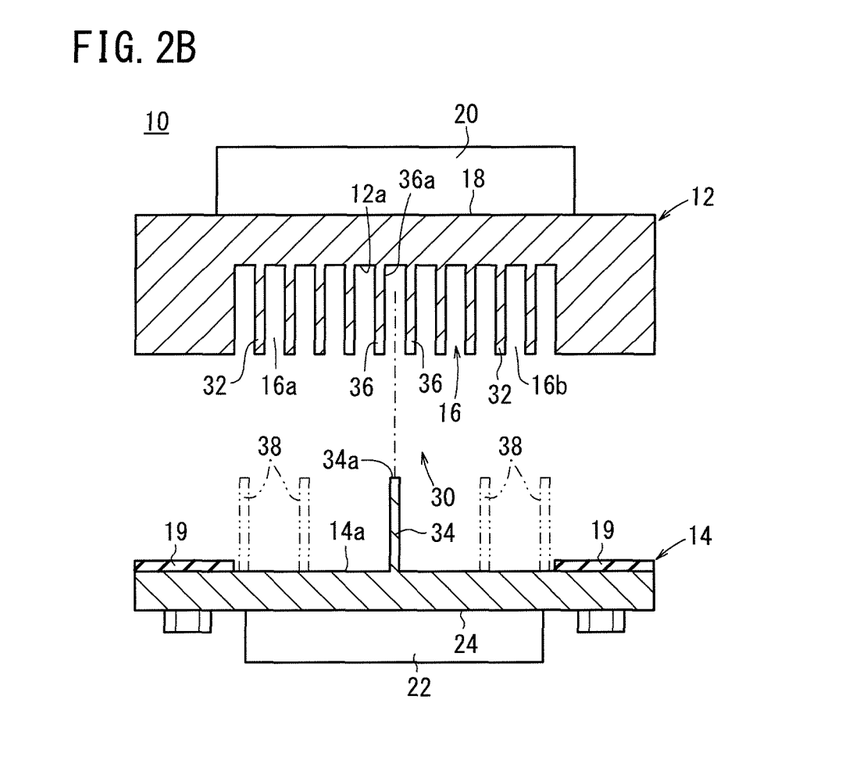
FIG. 2B is an exploded cross-sectional view of the cooling device shown in FIG. 2A, illustrating a heat sink body and a heat sink cap detached from the heat sink body.

As shown in FIGS. 1, 2A and 2B, the cooling device 10 serves as a cooling structure for cooling a target object 20, which is mounted on an installation surface (mount surface) 18 of a heat sink body 12, by passing a liquid refrigerant through a cooling passage (refrigerant channel) 16, which is defined in the heat sink body 12 and is closed by a heat sink cap 14. FIG. 1 is a cross-sectional view of the cooling device 10 taken along a plane parallel to the directions indicated by the arrows F1 and F2 in FIG. 1, along which the liquid refrigerant flows through the cooling passage 16.

The target object 20 to be cooled by the cooling device 10 may be an electric component such as an inverter (power converter) for use on electric automobiles, hybrid electric automobiles, fuel cell automobiles, etc., for example. Such an electric component is made up of various electric subcomponents, including switching elements, reactors, capacitors, etc. The electric component generates considerable heat when energized.

As shown in FIGS. 1, 2A and 2B, the cooling device 10 includes the heat sink body (casing) 12 in the form of a flat box having the cooling passage 16 defined therein, and the heat sink cap 14, which is intimately secured to a surface of the heat sink body 12 where the cooling passage 16 opens, thereby delimiting the cooling passage 16. The heat sink body 12 and the heat sink cap 14 are fastened to each other by bolts 21, with a sealing member 19 being sandwiched therebetween around the cooling passage 16 for sealing the cooling passage 16 in a liquid-tight fashion.

Figure 4A:
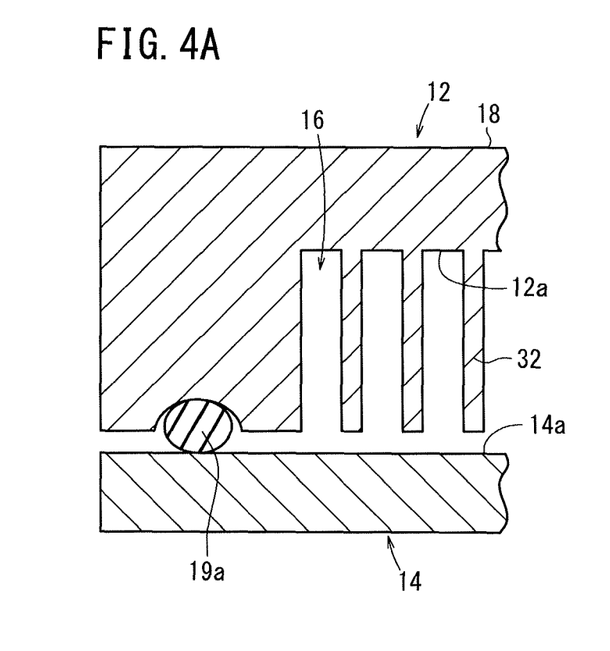
FIG. 4A is a fragmentary cross-sectional view showing a sealing member according to a first modification, which is disposed between the heat sink body and the heat sink cap.
Figure 4B:
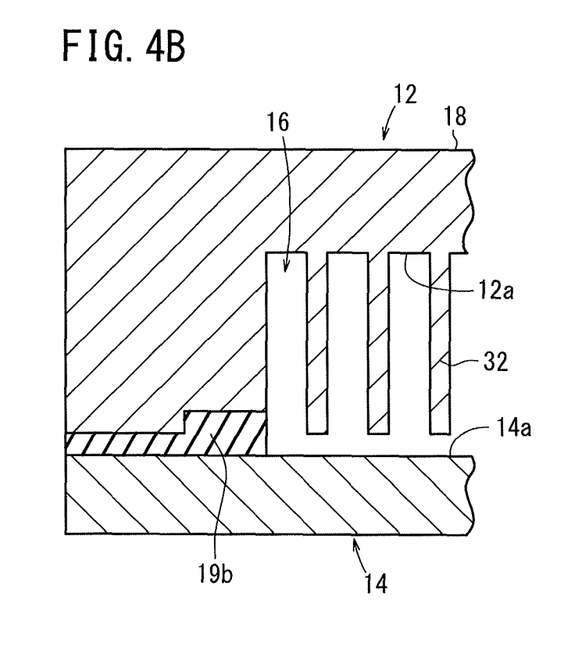
FIG. 4B is a fragmentary cross-sectional view showing a sealing member according to a second modification, which is disposed between the heat sink body and the heat sink cap.

As shown in FIGS. 2A and 2B, the sealing member 19 comprises a liquid packing, and is disposed along an outer circumferential surface of the heat sink body 12. However, as shown in FIG. 4A, the sealing member 19 may alternatively comprise a sealing member 19a (see FIG. 4A) in the form of an O-ring. As shown in FIG. 4B, the sealing member 19 may further alternatively comprise a sealing member 19b in the form of a liquid packing or a thin sheet packing, which is interposed between a stepped surface of the heat sink body 12 and an inner surface of the heat sink cap 14.

The installation surface 18 on which the target object 20 is mounted is provided on a surface (outer surface) of the heat sink body 12, which is remote from the cooling passage 16. The heat sink cap 14 has a surface (outer surface) that is remote from the cooling passage 16, and which serves as a second installation surface (second mount surface) 24 for mounting a second target object 22 thereon as another target object to be cooled. The target object 20 and the second target object 22 may be installed directly on the installation surface 18 and the second installation surface 24, respectively, although a heat radiating sheet made of copper, aluminum, or the like, or a liquid-phase heat radiating paste may also be interposed therebetween.

As shown in FIG. 1, a liquid refrigerant circulates through the cooling passage 16 via an inlet port 26 and an outlet port 28 that are defined in the heat sink body 12, thereby effectively cooling the target object 20 and the second target object 22, which are installed directly on the installation surface 18 and the second installation surface 24, respectively. A circulating pump, a radiator, etc., not shown, for example, are connected via piping to the inlet port 26 and the outlet port 28. When the circulating pump is actuated, the liquid refrigerant is circulated through the cooling passage 16. Heat, which is received by the liquid refrigerant from the target object 20 and the second target object 22, is radiated out of the cooling device 10 by the radiator.

The cooling passage 16 includes a straight first passageway (outward passageway) 16a through which a liquid refrigerant, such as water, a coolant, or the like introduced from the inlet port 26 initially flows, a turnaround section 16b for reversing the direction of the liquid refrigerant that has passed through the first passageway 16a, and a second passageway (homeward passageway) 16c through which the liquid refrigerant flows after having passed through the turnaround section 16b. The first passageway 16a and the second passageway 16c are separated from each other by a wall assembly 30. The liquid refrigerant, which has passed through the second passageway 16c, is discharged out of the cooling device 10 from the outlet port 28. After the heat from the discharged liquid refrigerant is radiated by the radiator, the liquid refrigerant is reintroduced into the inlet port 26.

As can be seen from FIG. 1, the cooling passage 16 is constructed as a roundabout channel, which is longer than a straight line interconnecting the inlet port 26 and the outlet port 28. The roundabout channel is made up of the first passageway 16a, the turnaround section 16b, and the second passageway 16c, as a roundabout channel between the inlet port 26 and the outlet port 28. The first passageway 16a and the second passageway 16c are separated from each other by the wall surfaces of the wall assembly 30. Such a structure makes the overall dimensions of the cooling device 10 as small as possible, while making it possible to provide a desired channel length.

As shown in FIGS. 1, 2A and 2B, the cooling passage 16 houses therein a plurality of cooling fins 32 in the form of thin plates extending along the direction in which the liquid refrigerant flows. The cooling fins 32 project from a first surface 12a, which is the inner surface of the heat sink body 12, and terminate short of a second surface 14a, which is the inner surface of the heat sink cap 14 that confronts the first surface 12a (see FIG. 2A).

The cooling fins 32, which are made of a material that exhibits high thermal conductivity, e.g., copper, aluminum, or the like, are capable of transmitting heat from the target object 20 highly efficiently to the liquid refrigerant. The heat sink body 12 and the heat sink cap 14 may be made of the same material as the cooling fins 32. The heat sink body 12 and the cooling fins 32 have an integral structure produced by aluminum die casting.

According to the present embodiment, each of the first passageway 16a and the second passageway 16c, which constitute straight sections of the cooling passage 16, accommodates therein three sets of four straight cooling fins 32, which extend along the direction in which the liquid refrigerant flows. As viewed in plan in FIG. 1, the four straight cooling fins 32 lie parallel to each other in widthwise directions of the cooling passage 16, i.e., in directions perpendicular to the direction in which the liquid refrigerant flows. Each of respective sections formed upstream and downstream of the first passageway 16a, i.e., curved sections of the cooling passage 16, houses therein a set of three curved cooling fins 32, which line parallel to each other in the widthwise direction of the cooling passage 16. Each of respective sections formed upstream and downstream of the second passageway 16c houses therein a similar set of three curved cooling fins 32. The number of installed cooling fins 32 and the intervals at which the cooling fins 32 are installed can be changed appropriately depending on the specifications and application of the cooling device 10 and the type of target object 20.

Figure 3:
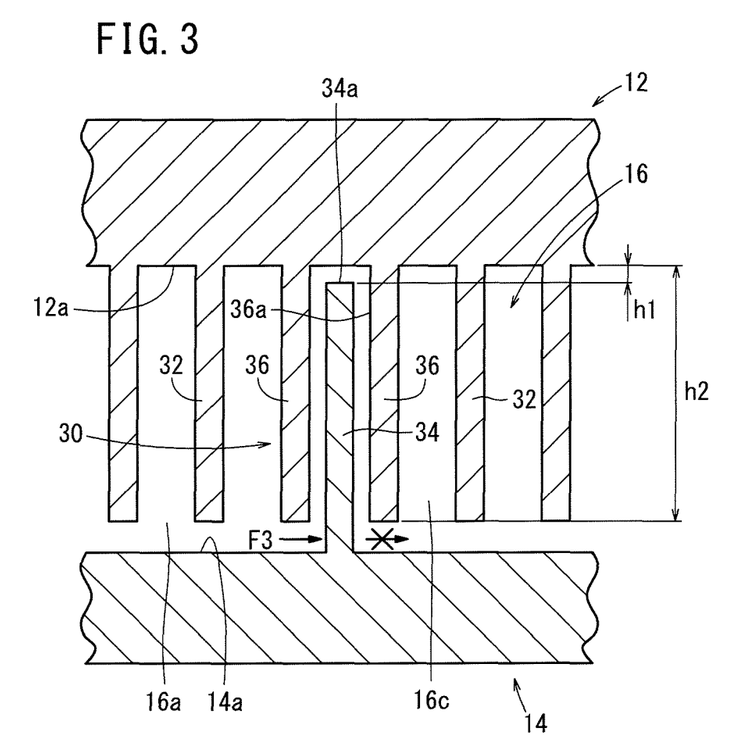
FIG. 3 is an enlarged fragmentary cross-sectional view of a wall disposed in a cooling passage together with other nearby parts.

As shown in FIG. 3, the wall assembly 30, by which the first passageway 16a and the second passageway 16c are separated from each other, has a first wall 34 that extends from the second surface 14a toward the first surface 12a, and second walls 36 that extend from the first surface 12a in parallel with the first wall 34, to a height beyond the top (top surface) 34a of the first wall 34. The height h2 of the second walls 36, which project from the first surface 12a, is greater than the distance h1 from the top 34a of the first wall 34 to the first surface 12a (h1<h2), so that the tops of the first wall 34 and the second walls 36 are staggered and positioned adjacent to each other in overlapping relation.

According to the present embodiment, the second walls 36 are provided as a pair in sandwiching relation to the first wall 34. The wall assembly 30 thus provides a labyrinth structure, with the first wall 34 being inserted in a recess 36a defined between the pair of second walls 36.

As shown in FIG. 1, the wall assembly 30 extends parallel to the flow directions of the refrigerant in the first passageway 16a and the second passageway 16c, from a position corresponding to the inlet port 26 and the outlet port 28 to an inner circumferential surface of the turnaround section 16b. The first passageway 16a is defined on one surface side of the wall assembly 30, and the second passageway 16c is defined on the other surface side of the wall assembly 30.

Operations and advantages of the cooling device 10 which is constructed in the foregoing manner will be described below.

If the cooling device 10 is used to cool an inverter mounted on an electric automobile, for example, the switching elements thereof, for example, are installed as a target object 20 on the installation surface 18, whereas the reactor, for example, is installed as the second target object 22 on the second installation surface 24. Under the control of a controller such as an ECU or the like of the electric automobile, liquid refrigerant is circulated from the inlet port 26 to the outlet port 28 by the circulating pump and the radiator. Therefore, the target object 20 is cooled by means of heat exchange between the liquid refrigerant that flows through the cooling passage 16 and the cooling fins 32 and the first surface 12a. Similarly, the second target object 22 is cooled by means of heat exchange between the liquid refrigerant and the second surface 14a.

With the cooling device 10 according to the present embodiment, the cooling passage 16 is constructed as a channel, which is longer than a straight line interconnecting the inlet port 26 and the outlet port 28. The wall assembly 30 is disposed between the first surface 12a of the heat sink body 12 and the second surface 14a of the heat sink cap 14, thereby dividing the cooling passage 16 into the first passageway 16a and the second passageway 16c. The wall assembly 30 includes the first wall 34 that extends from the second surface 14a toward the first surface 12a, and the second walls 36 that extend from the first surface 12a in parallel with the first wall 34 to a height beyond the top 34a of the first wall 34. The first wall 34 and the second walls 36 have confronting wall surfaces lying parallel to each other. The expression that the first wall 34 and the second walls 36 lie parallel to each other covers not only the wall surfaces thereof lying completely in parallel with each other, but also that the wall surfaces lie substantially parallel to each other while being slightly inclined, such that the wall surfaces are spaced from each other by distances with slight clearances, and that the wall surfaces are held in contact with each other due to face-to-face contact therebetween, insofar as the first wall 34 and the second walls 36 are juxtaposed to such an extent that the first wall 34 and the second walls 36 are effective to prevent liquid refrigerant from flowing easily from the first passageway 16a over the wall assembly 30 and into the second passageway 16c.

Therefore, even if a flow F3 (see FIGS. 1 and 3) is generated in the liquid refrigerant from the first passageway 16a into the second passageway 16c in a direction directly from the inlet port 26 toward the outlet port 28, under the pressure of the liquid refrigerant that flows in from the inlet port 26 and the pressure of the liquid refrigerant that flows through the cooling passage 16, the labyrinth structure, in which the first wall 34 and the second walls 36 are disposed in overlapping relation to each other, enables the wall assembly 30 to impose a very high flow resistance, thereby preventing the flow F3 from flowing by way of a short cut across and over the wall surfaces of the wall assembly 30.

More specifically, since the second walls 36 extend to a height beyond the top 34a of the first wall 34, the wall assembly 30 reliably maintains a flow blocking function (refrigerant leakage blocking function), even if the gap accuracy in the vicinity of the wall assembly 30 is low as a result of poor assembly and machining accuracy of the heat sink body 12 and the heat sink cap 14, and due to curvature of the heat sink cap 14 caused by the pressure of the liquid refrigerant. Consequently, the liquid refrigerant flows smoothly through the cooling passage 16, thereby appropriately cooling the target object 20 and the second target object 22. Further, since the cooling device 10 has a complex and elongate labyrinth structure in which the first wall 34 is inserted in the recess 36a defined between the pair of second walls 36, the flow blocking function is rendered more effective.

As described above, the cooling device 10 includes the wall assembly 30 disposed in the cooling passage 16 to prevent the liquid refrigerant from flowing directly from the first passageway 16a into the second passageway 16c. Therefore, the sealing member 19 (19a, 19b), which is interposed between the heat sink body 12 and the heat sink cap 14, may be disposed only in one position (e.g., the position indicated by the two-dot-and-dash lines S shown in FIG. 1) along the outer circumferential surface of the heat sink body 12 (cooling passage 16). Stated otherwise, since there is no need for a sealing member to be disposed in a position corresponding to the wall assembly 30 that separates the first passageway 16a and the second passageway 16c from each other, the cooling device 10 is simple in structure, and can be manufactured with increased efficiency at a reduced cost.

In the above embodiment, the cooling fins 32 are mounted only on the first surface 12a, which is on the opposite side of the installation surface 18 on which the target object 20 is installed. However, second cooling fins 38 (see the two-dot-and-dash lines in FIGS. 2A and 2B) may be mounted on the second surface 14a, which is on the opposite side from the second installation surface 24 on which the second target object 22 is installed. The second cooling fins 38 may also be positioned in gaps formed between adjacent ones of the cooling fins 32.

The second cooling fins 38, which are included in this manner, are effective to increase the cooling performance on the second target object 22. Furthermore, the second cooling fins 38 increase the rigidity of the heat sink cap 14, thereby preventing the heat sink cap 14 from becoming curved under the pressure of the liquid refrigerant, and preventing the liquid refrigerant from leaking across and over the wall assembly 30 more reliably. Since the heat sink cap 14 can be reduced in thickness while maintaining a sufficient level of rigidity, the cooling device 10 can be reduced in size and weight. Further, only the second cooling fins 38 may be provided on the heat sink cap 14, whereas the cooling fins 32 on the heat sink body 12 may be dispensed with. One or three or more target objects may be cooled by the cooling device 10.

Figure 5:
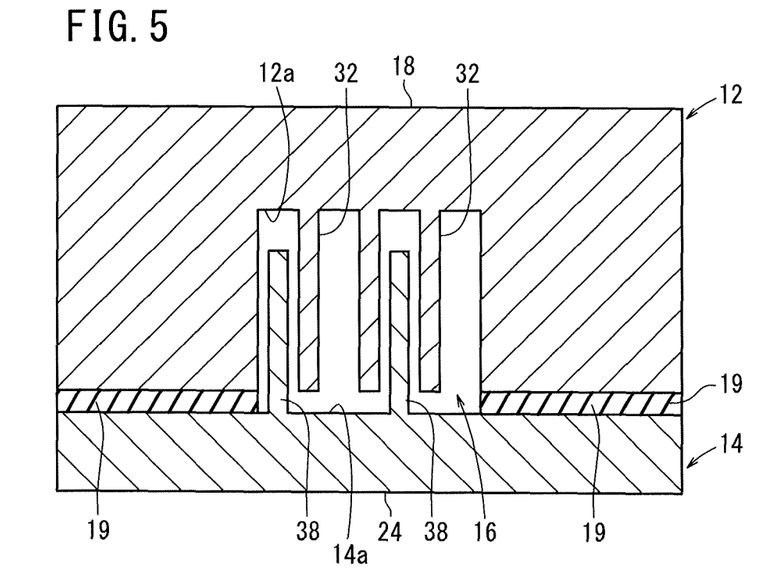
FIG. 5 is a cross-sectional view taken along line V-V of FIG. 1, showing second cooling fins disposed on the heat sink cap.

FIG. 5 is a cross-sectional view taken along line V-V of FIG. 1, showing the second cooling fins 38 disposed on the heat sink cap 14, in a curved section located downstream from the second passageway 16c. As shown in FIG. 5, the second cooling fins 38, which are disposed on the heat sink cap 14, may be positioned in curved sections of the cooling passage 16. If the second cooling fins 38 are disposed on the heat sink cap 14 in curved sections of the cooling passage 16, in and particular, in curved sections disposed near the inlet port 26 and the outlet port 28, then the second cooling fins 38 overlap alternately with the cooling fins 32, thereby producing a wall surface effect that minimizes seepage of liquid refrigerant onto the contacting surfaces of the heat sink body 12 and the heat sink cap 14. Therefore, the flow blocking function of the wall assembly 30 is rendered more effective.

In the above embodiment, the wall assembly 30 that is disposed in the cooling passage 16 includes the first wall 34 and the second walls 36, which extend vertically between the first surface 12a and the second surface 14a in parallel with the cooling fins 32. However, the wall assembly may be of a structure other than that shown in FIG. 3, insofar as the structure is capable of preventing liquid refrigerant from flowing directly by way of a short cut from the first passageway 16a into the second passageway 16c.

Figure 6A:
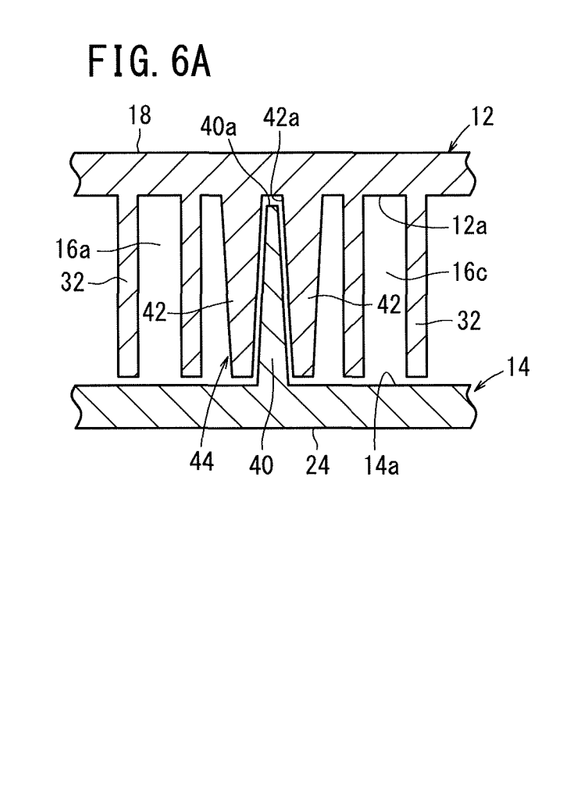
FIG. 6A is a fragmentary cross-sectional view showing a wall assembly according to another modification.
Figure 6B:
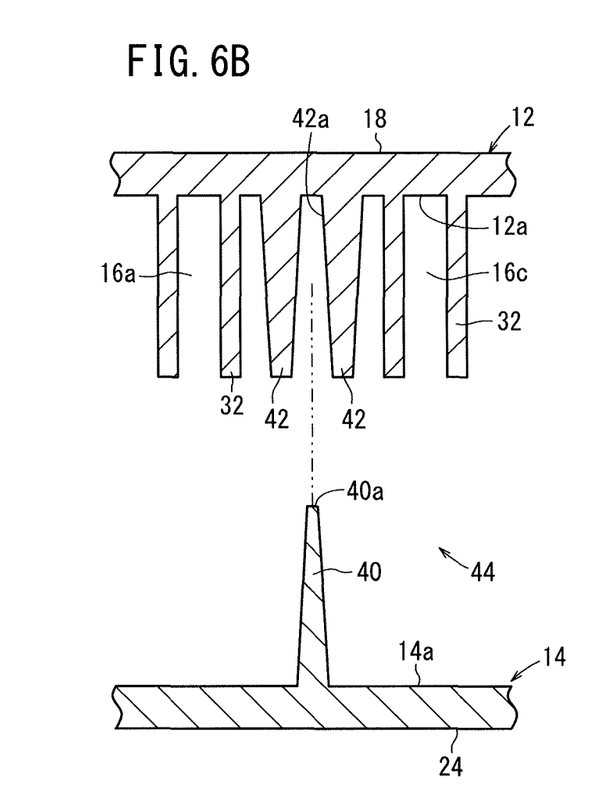
FIG. 6B is a fragmentary exploded cross-sectional view of the wall assembly shown in FIG. 6A, with the heat sink cap being detached from the heat sink body.

For example, as shown in FIGS. 6A and 6B, the wall assembly 30 may be replaced with a wall assembly 44 having a tapered first wall 40, and second walls 42, which are disposed in overlapping relation to the first wall 40 and have wall surfaces that lie parallel or substantially parallel to the wall surface of the first wall 40. The wall assembly 44 also includes a recess 42a defined between the second walls 42, which are provided as a pair, the recess 42a becoming progressively wider toward the open end thereof. Therefore, when the heat sink body 12 and the heat sink cap 14 are assembled together, the top 40a of the first wall 40 is easily inserted into the recess 42a. The wall assembly 44 can thus be assembled with utmost ease.

The above-described wall assembly 30 has the first wall 34 and the second walls 36, which lie parallel to the cooling fins 32. Since the first wall 34 and the second walls 36 extend perpendicularly from the second surface 14a and the first surface 12a, respectively, the wall assembly 30 imposes a higher flow resistance on the liquid refrigerant than on the wall assembly 44, and functions more highly to block the flow of the liquid refrigerant.

A U-shaped cooling passage 16, which includes the first passageway 16a and the second passageway 16c with the turnaround section 16b being interposed therebetween, has been illustrated above. However, the cooling passage may have another shape, e.g., a V shape, an S shape, or the like. Even if the cooling passage is formed in a V-shape or an S-shape, the cooling passage is effective at preventing liquid refrigerant from flowing directly from the inlet port into the outlet port, with a wall assembly that is similar to the wall assembly 30.

The present invention is not limited to the above embodiments, but various arrangements may be adopted therein without departing from the scope of the invention.

The invention claimed is:

1. A cooling structure comprising:
    an installation surface for placement of a target object to be cooled;
    a plurality of cooling fins disposed side by side on a reverse side of the installation surface; and
    a cooling passage configured to cool the cooling fins with a liquid refrigerant that flows from an inlet port into the cooling passage and is discharged from an outlet port,
    wherein the cooling passage comprises:
        a first surface on which the cooling fins are disposed;
        a second surface facing the first surface; and
        a wall assembly disposed between the first surface and the second surface, the cooling passage constructed as a channel having a length that is longer than a straight line interconnecting the inlet port and the outlet port,
    wherein the wall assembly comprises:
        a first wall that extends from the second surface toward the first surface; and
        a second wall that extends in parallel with the first wall from the first surface to a height beyond a top of the first wall,
    wherein the second wall comprises:
        a pair of wall portions arranged to sandwich the first wall, each wall portion of the pair of wall portions extends in parallel with the first wall, and is formed continuously with each other,
    wherein a distance between the first wall and the second wall is shorter than a distance between the adjacent cooling fins.

2. The cooling structure according to claim 1, wherein the first wall and the second wall lie parallel to the cooling fins.

3. The cooling structure according to claim 1, further comprising:
    second cooling fins disposed on the second surface and positioned in the cooling passage in juxtaposed relation to the cooling fins; and
    a second installation surface disposed on a reverse side of the second surface for placement of a second target object to be cooled by the second cooling fins.

4. The cooling structure according to claim 1, wherein the second wall includes a recess, the first wall being inserted into the recess.

5. The cooling structure according to claim 1, wherein the cooling passage has the liquid refrigerant that flows therein in different directions respectively on one surface side and another surface side of the wall assembly.

6. The cooling structure according to claim 5, wherein the cooling passage has a turnaround section on a way from the inlet port to the outlet port; and
    the wall assembly divides the cooling passage, which is fluidly communicated with the turnaround section, into an outward passageway and a homeward passageway.

7. The cooling structure according to claim 2, further comprising:
    second cooling fins disposed on the second surface and positioned in the cooling passage in juxtaposed relation to the cooling fins; and
    a second installation surface disposed on a reverse side of the second surface for placement of a second target object to be cooled by the second cooling fins.

8. The cooling structure according to claim 1, wherein the top of the first wall is spaced apart from the second surface of the cooling passage.

* * * * *